United States Patent
Bashaboina et al.

(10) Patent No.: US 8,954,901 B2
(45) Date of Patent: Feb. 10, 2015

(54) PARAMETER VARIATION IMPROVEMENT

(75) Inventors: Pavan Y. Bashaboina, Hyderabad (IN);
Brent A. Goplen, Underhill, VT (US);
Howard S. Landis, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/958,979

(22) Filed: Dec. 2, 2010

(65) Prior Publication Data
US 2012/0144354 A1    Jun. 7, 2012

(51) Int. Cl.
*G06F 17/50*    (2006.01)

(52) U.S. Cl.
USPC .............................. 716/56; 716/54; 716/124

(58) Field of Classification Search
USPC .......................................................... 716/56
See application file for complete search history.

(56) References Cited

U.S. PATENT DOCUMENTS

| | | |
|---|---|---|
| 2008/0203589 A1 | 8/2008 | Bailey et al. |
| 2009/0106725 A1* | 4/2009 | Wang et al. ..................... 716/10 |
| 2009/0319973 A1* | 12/2009 | Anderson et al. ................. 716/9 |
| 2010/0035367 A1* | 2/2010 | Izuha et al. ..................... 438/14 |
| 2010/0050138 A1* | 2/2010 | Chidambarrao et al. ......... 716/5 |

* cited by examiner

*Primary Examiner* — Vuthe Siek
*Assistant Examiner* — Aric Lin
(74) *Attorney, Agent, or Firm* — Richard M. Kotulak; Hoffman Warnick LLC

(57) ABSTRACT

Variation of a parameter of interest is reduced over a field of interest in, for example, an object design, such as a circuit design. The field of interest is divided into tiles. A parameter value is found for each tile and for a group of tiles around each tile. Using these values, variation of the parameter is determined. An adjusted value of the parameter for each tile is determined taking limits into account, iterating until variation is below a threshold value. Parameter uniformity is improved in some applications by over 30% with runtime reduced by an order of magnitude.

17 Claims, 10 Drawing Sheets

PARAMETER VARIATION IMPROVEMENT

BACKGROUND

The present invention relates to circuit designs and, more specifically, to a method of designing and a method of manufacturing a design structure reducing variation of parameters to improve parameter uniformity over the design.

As semiconductor devices continue to be scaled down in size, tolerance for dimensions is also reduced. In addition, total variation for many device components increases so that one device on a substrate may have very different properties than another device on the same substrate. As the number of levels of interconnecting conductors increases, smaller variations and more patterns are required to stay within the smaller tolerance. Imposing better controls results in more computational effort to enable design and manufacture of semiconductor devices to specifications. The use of "Dummy Fill" shapes has been useful toward reducing parameter variation, such as pattern density variation, in a design, and by reducing that parameter variation, device variations are also reduced, which improves yield and/or performance of the devices. There is a need for methods of dynamically determining the target parameter values, such as target pattern density, and of adjusting the parameter, such as by defining a Dummy Fill shape at any point of the chip, in more computationally efficient ways that still impose better controls and keep the resulting designs within tolerances.

BRIEF SUMMARY

According to one embodiment of the present invention, a method of reducing variation of a parameter of a circuit design provides a circuit design and identifies a field of interest and a parameter of interest for the circuit design. The field of interest is divided into a plurality of tiles, and initial values of the parameter of interest are determined for the field of interest and for each tile of the plurality of tiles. A variation of the parameter of interest is determined, the parameter of interest is adjusted, and the variation of the adjusted parameter of interest is compared to an exit condition. If the exit condition is satisfied, then the design is stored, and if the exit condition is not met, the steps of calculating, adjusting, and comparing are repeated with the adjusted values set as the initial values of the parameter of interest.

In addition, in an embodiment a method of reducing variation of a parameter identifies a field of interest and a parameter of interest. An initial value of the parameter of interest over the entire field of interest is determined, and the field of interest is divided into a plurality of tiles. An initial value of the parameter of interest for each of the plurality tiles is determined, as well as an initial tile standard deviation for each of the plurality of tiles using the initial value of the parameter of interest over the entire field and the initial value of the parameter of interest for each of the plurality of tiles. Using the initial value of the parameter of interest for each tile and initial values of tiles encompassed by a region around the respective tile, a target value of the parameter of interest for each of the plurality of tiles is determined. The parameter is adjusted for each tile in accordance with the target value to reduce standard deviation of the parameter for the respective tile. If an exit condition is met, such as the standard deviation being below a threshold value, the adjusted design is stored, but if the condition is not met, the adjusted values become the initial values and the process is repeated until the exit condition is met.

In embodiments, a target parameter may be pattern density, such as of a semiconductor design, though other parameters may be used, such as reflectivity or perimeter density, for example. Additionally, the parameter of interest may be adjusted by defining dummy fill shapes for areas on a semiconductor design which best meets the target value of the parameter of interest. Variation may be determined using standard deviation in embodiments or other indicators as may be appropriate or desired.

Embodiments include a computer program product for optimizing at least one parameter of an object design, the product including at least one storage medium, readable by a processing circuit, that stores an object design and that stores instructions for execution by the processing circuit for identifying a field of interest and a parameter of interest, determining an initial value of the parameter of interest over the entire field of interest, dividing the field of interest into a plurality of tiles, determining an initial value of the parameter of interest for each of the plurality tiles, and determining an initial tile standard deviation for each of the plurality of tiles using the initial value of the parameter of interest over the entire field and the initial value of the parameter of interest for each of the plurality of tiles. Additionally, the instructions in embodiments include instructions for determining a target value of the parameter of interest for each of the plurality of tiles using the initial value of the parameter of interest for each tile and initial values of tiles encompassed by a region around the respective tile, adjusting the parameter for each tile in accordance with the target value to reduce standard deviation of the parameter for the respective tile, and storing the adjusted object design on the storage medium.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
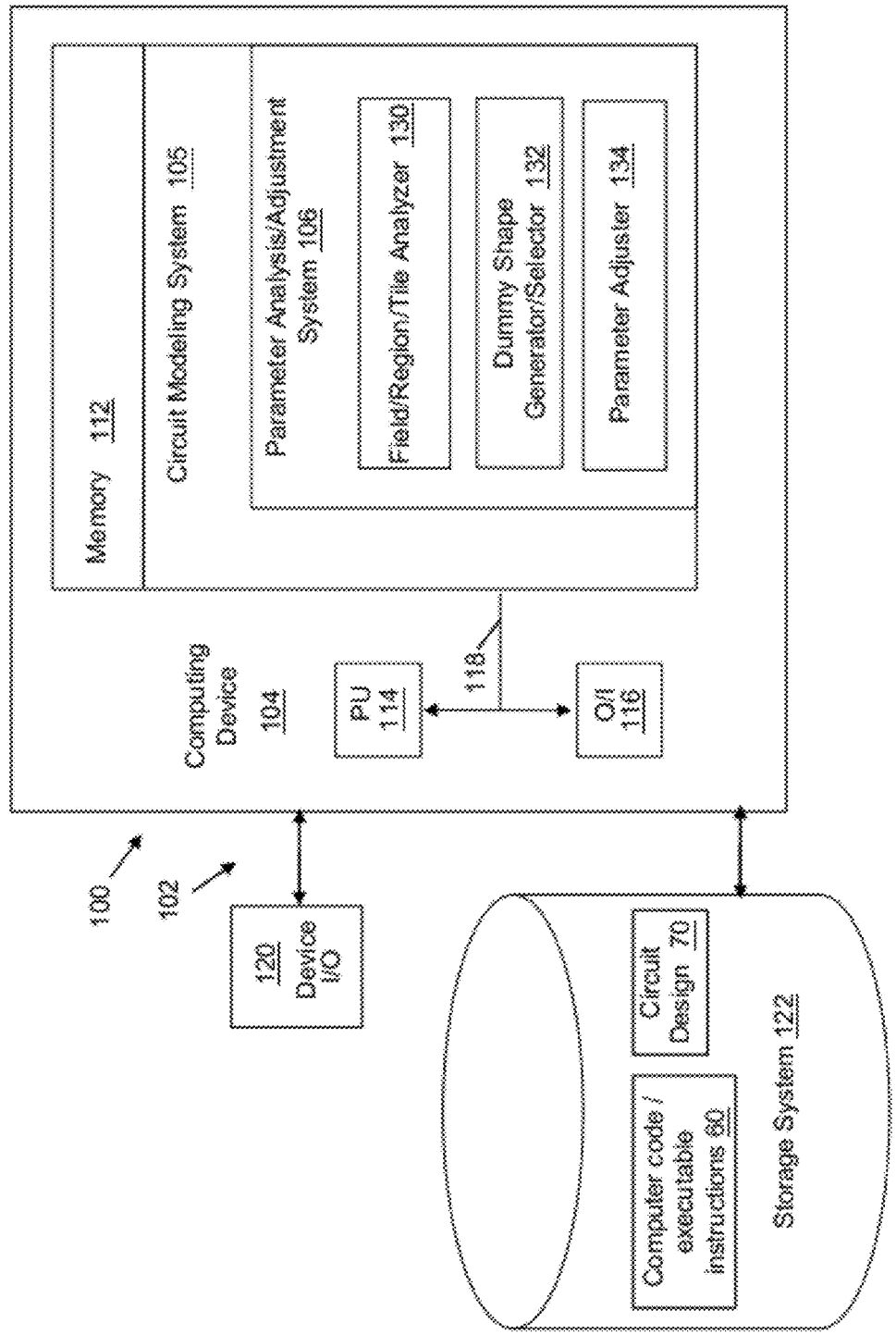
FIG. 1 is a schematic diagram of a computer-based system that may employ an embodiment.

With reference now to FIG. 1, a computer-based system 100 includes a computing device 104 connected to an input/output (I/O) device 120 and a storage system 122. The I/O device 120 is connected to the computing device 104 via a connection 102, such as a cable, a Bluetooth connection, etc. The computing device 104 according to an embodiment may include a memory 112 connected to a processing unit (PU) 114 and/or an input/output (I/O) system 116 via a system bus 118. The storage system 122 in embodiments stores a circuit design 70 and computer-readable instructions for execution by the processing unit 114 that may be loaded into the memory 112 when the instructions are to be executed. When the instructions are loaded into the memory 112 according to embodiments, a circuit modeling system 105 is formed and includes a parameter analysis and adjustment system 106 with a field/region/tile analyzer 130, a dummy shape generator/selector 132, and/or a parameter adjuster 134, used as will be described.

Figure 2:
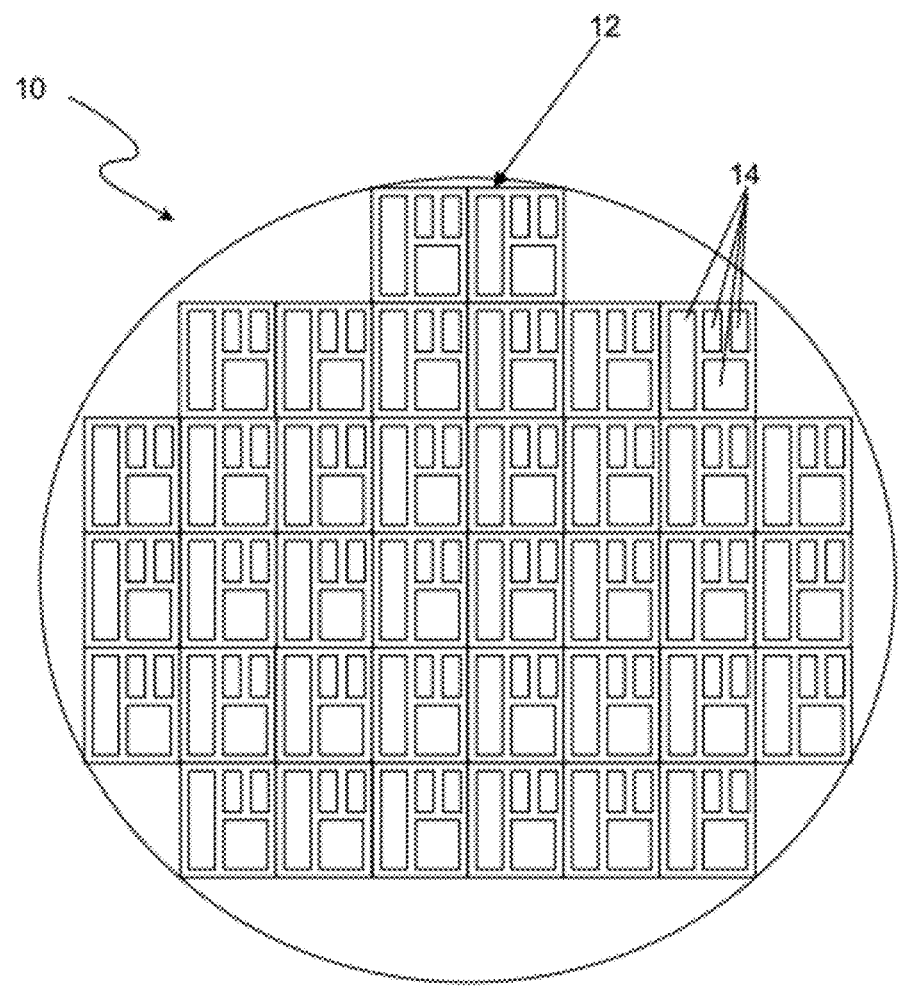
FIG. 2 is a schematic diagram of an object design to which embodiments may be applied.
Figure 4:
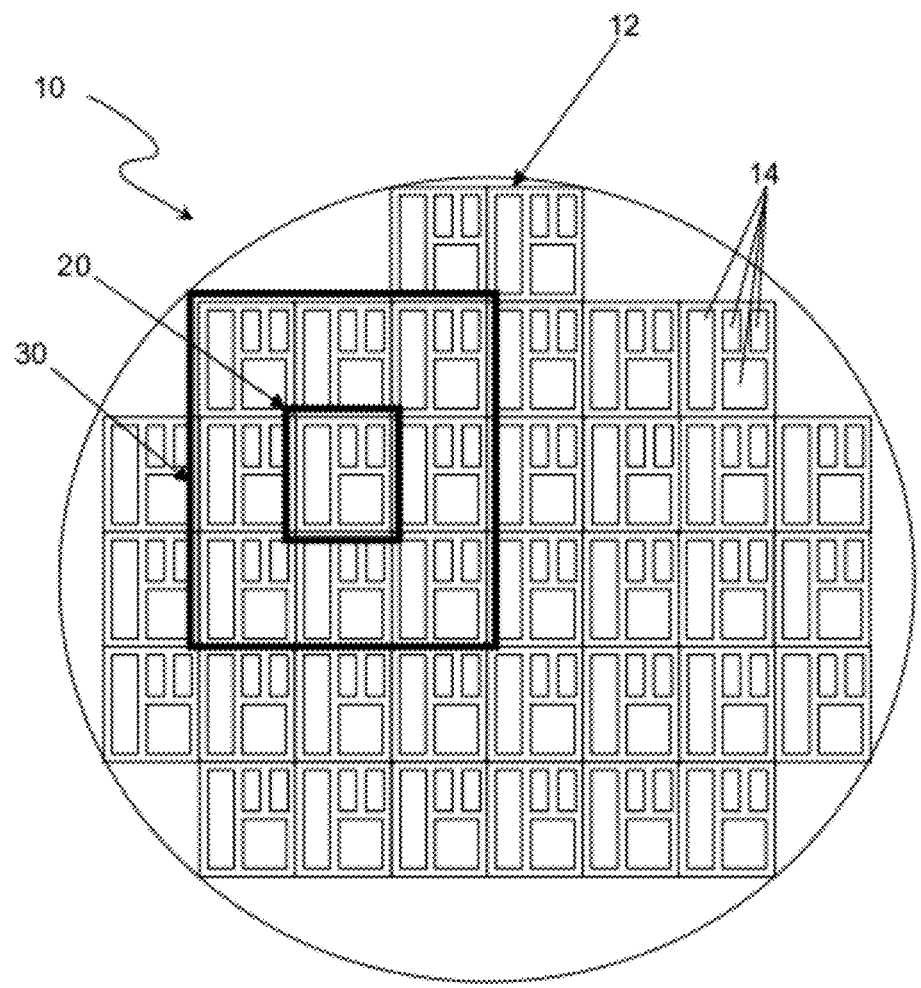
FIG. 4 is a schematic diagram of the object design of FIG. 2 to which an embodiment is applied.
Figure 5:
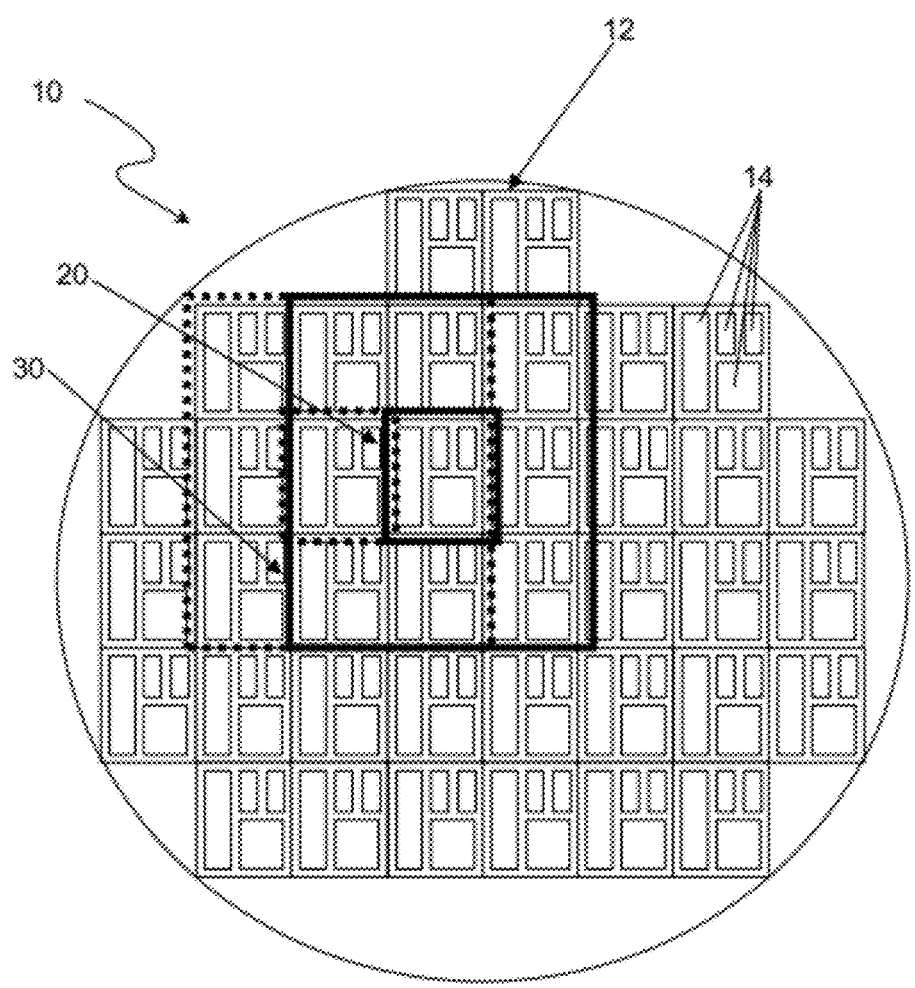
FIG. 5 is a schematic diagram of the object design of FIGS. 2 and 3 to which an embodiment is applied.

FIG. 2 shows an example of a type of object design 10 to which embodiments may be applied. By way of example, the object design 10 is a semiconductor wafer on which a plurality of devices 12 are formed, each device 12 having at least one component 14. The number, size, and shape of the devices 12 and components 14 as shown are solely for example, and it should be recognized that embodiments can be applied to object designs of any shape, with any number of devices, the devices having any number of components, dummy shapes, or any other features. This exemplary object design 10 is also shown in FIGS. 4 and 5 to aid in explanation of embodiments.

Figure 3:
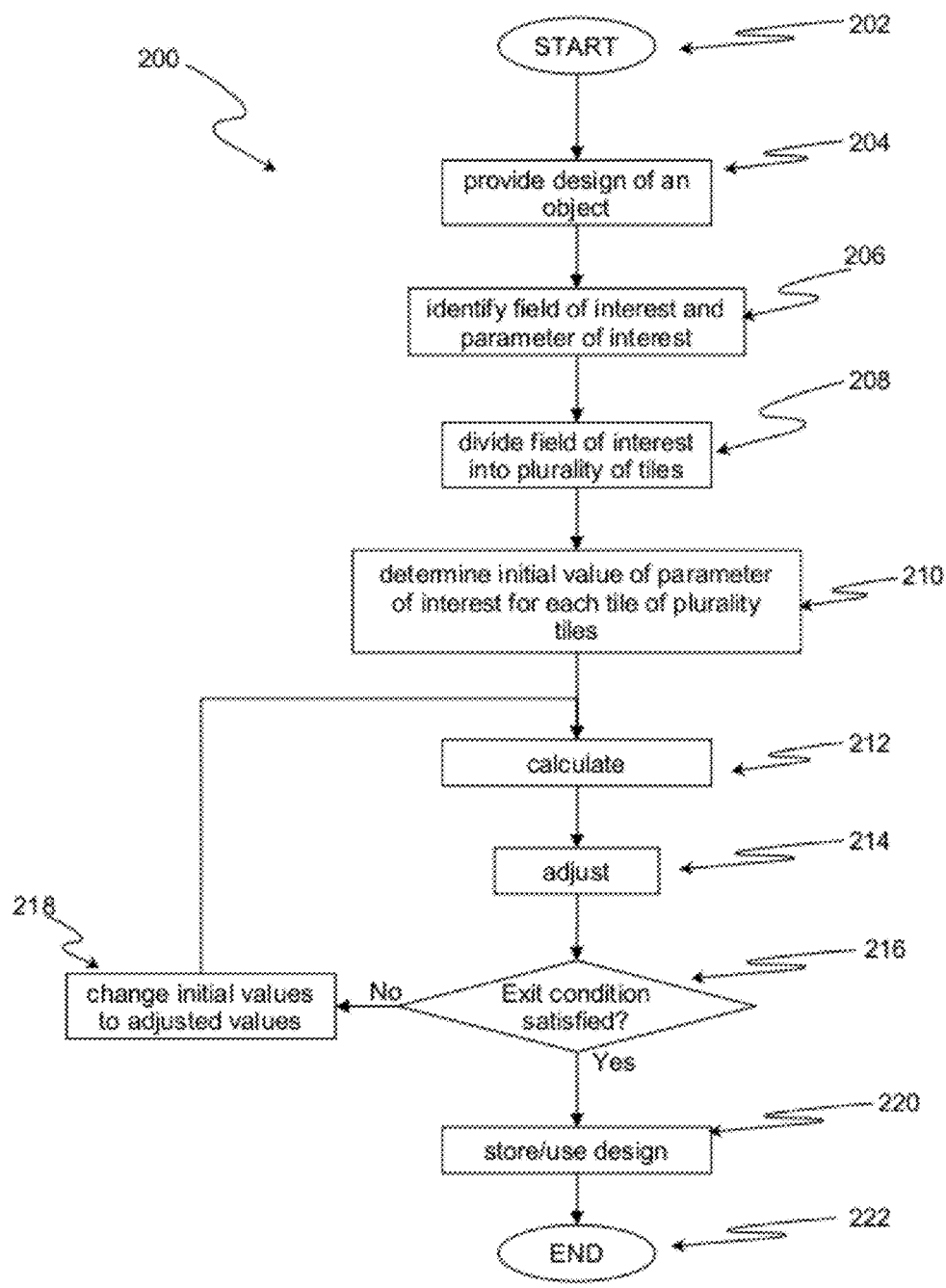
FIG. 3 is a schematic flow diagram of a method of an embodiment.

With reference now to FIGS. 2 and 3, a method of parameter optimization 200 starts (block 202) with providing the design of an object (block 204), such as a circuit, and identifies a field of interest and a parameter of interest (block 206) of the design. For example, the object design 10 shown in FIGS. 2, 4, and 5 can be provided and the field of interest may be identified as the entire object surface. The field of interest is divided into a plurality of tiles (block 208), such as the devices 12 of the object design 10, and initial values of the parameter of interest for each tile of the plurality of tiles is determined (block 210). The tiles need not correspond to entire devices on a chip. In embodiments, the number of tiles is determined using an effective length scale of the parameter of interest. Calculations ensue (block 212), such as variation of the parameter of interest and estimates of what values the tiles should have, and the parameter of interest is adjusted (block 214). Once adjusted, the adjusted parameter is compared to an exit condition (block 216). If the exit condition is not met, then the initial values are set to the adjusted values (block 218) and the steps of calculating, adjusting, and comparing (blocks 212-216) are repeated until the exit condition is met. If the exit condition is met, then the adjusted design is stored and/or used (block 220) and the method ends (block 222).

Figure 6:
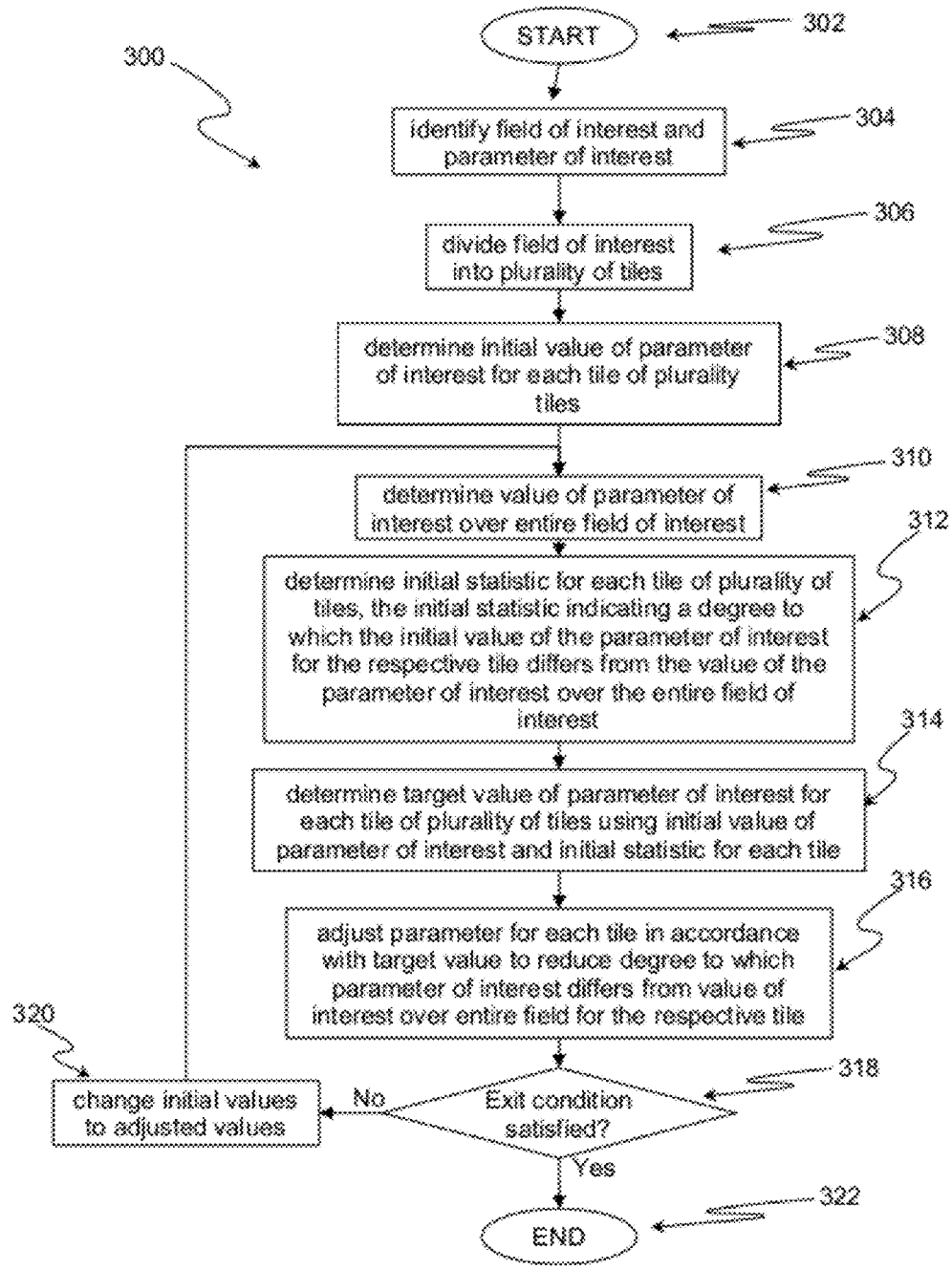
FIG. 6 is a schematic flow diagram of a method of an embodiment.

With reference to FIG. 6, a parameter optimization method 300 according to an embodiment starts (block 302) by identifying a field of interest and a parameter of interest (block 304) and dividing the field of interest into a plurality of tiles (block 306), and determining initial values of the parameter of interest for each tile of the plurality of tiles (block 308). The field of interest may be selected from or in an object design, such as a circuit design, and the parameter of interest may be a characteristic of the object design. In the case of a circuit design, the parameter of interest may be pattern density, perimeter density, reflectivity, or another characteristic of a circuit design as appropriate or desired by a user. The method determines a value of the parameter of interest over the entire field of interest using the initial values (block 310) and determines an initial statistic for each tile of the plurality of tiles that indicates a degree to which the initial value of the parameter of interest varies (block 312). For example, the initial statistic in embodiments indicates a degree to which the value of the parameter of interest for each tile of the plurality of tiles differs from the value of the parameter of interest over the entire field of interest. A target value of the parameter of interest is determined for each tile of the plurality of tiles using the initial value of the parameter of interest and the initial statistic for each tile (block 314), and the parameter is adjusted in accordance with the target values to reduce variation of the parameter of interest (block 316), such as, for example, to reduce the degree to which the parameter of interest differs from the value of the parameter of interest over the entire field of interest for each tile. The adjusted design is compared to an exit condition (block 318), such as to see whether variation is below a threshold. If the exit condition is not satisfied, the adjusted values become the initial values (block 320) and the steps of determining the value of the parameter of interest over the entire field of interest, determining the initial statistic for each tile, determining a target value of the parameter of interest for each tile, adjusting the value of the parameter of interest, and comparing to an exit condition (blocks 310-318) are repeated. If the exit condition is satisfied, the method ends (block 322), such as by storing and/or using the adjusted design.

Figure 7:
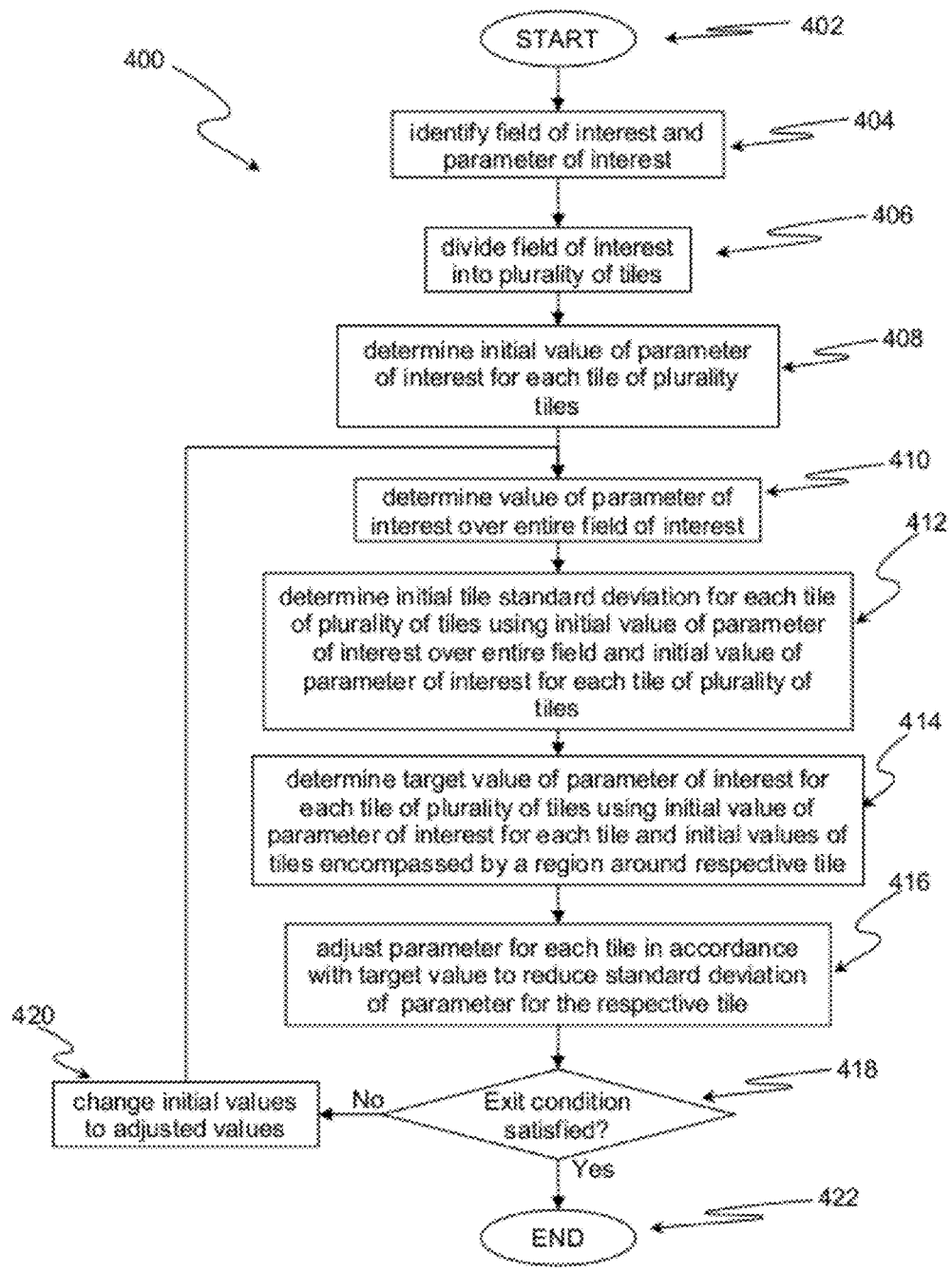
FIG. 7 is a schematic flow diagram of a method of an embodiment.

With reference to FIG. 7, a parameter optimization method 400 according to an embodiment starts (block 402) by identifying a field of interest and a parameter of interest (block 404) and dividing the field of interest into a plurality of tiles (block 406), and determining initial values of the parameter of interest for each tile of the plurality of tiles (block 408). The field of interest may be selected from or in an object design, such as a circuit design, and the parameter of interest may be a characteristic of the object design. In the case of a circuit design, the parameter of interest may be pattern density, perimeter density, reflectivity, or another characteristic of a circuit design as appropriate or desired by a user. The method determines a value of the parameter of interest over the entire field of interest using the initial values (block 410) and determines an initial standard deviation for each tile of the plurality of tiles using the initial value of the parameter of interest for each tile and the initial value of the parameter of interest over the entire field of interest (block 412). A target value of the parameter of interest is determined for each tile of the plurality of tiles using the initial value of the parameter of interest and the initial standard deviation for each tile (block 414), and the parameter is adjusted in accordance with the target values to reduce standard deviation of the parameter of interest (block 416). The adjusted parameter is compared to an exit condition (block 418), such as to see whether standard deviation is below a threshold. If the exit condition is not satisfied, the adjusted values become the initial values (block 420) and the steps of determining the value of the parameter of interest over the entire field of interest, determining the initial standard deviation for each tile, determining a target value of the parameter of interest for each tile, adjusting the value of the parameter of interest, and comparing to an exit condition (blocks 410-418) are repeated. If the exit condition is satisfied, the method ends (block 422), such as by storing and/or using the adjusted design.

Figure 8:
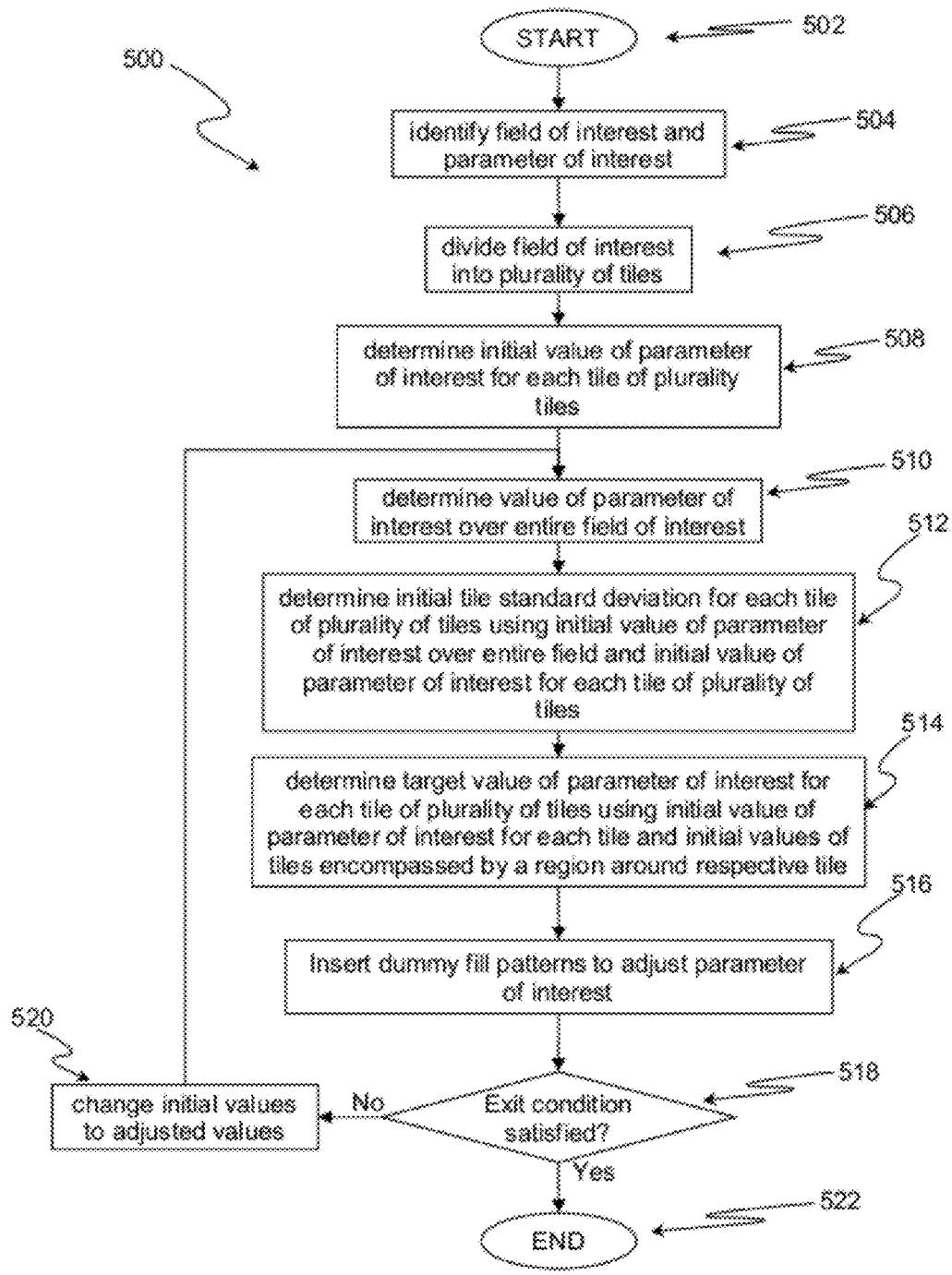
FIG. 8 is a schematic flow diagram of a method of an embodiment.
Figure 9:
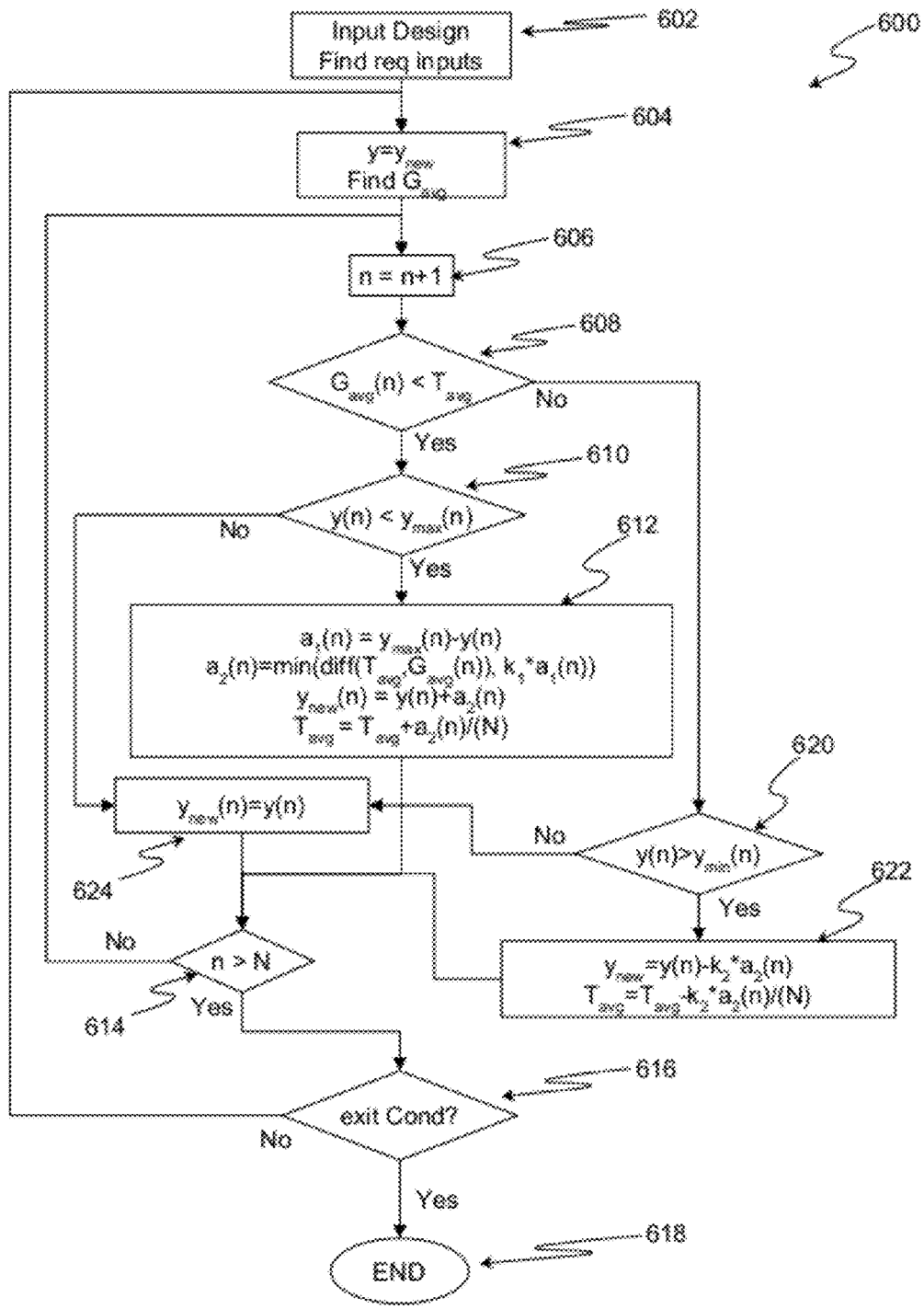
FIG. 9 is a schematic flow diagram of a method of an embodiment.

With reference to FIG. 8, a parameter optimization method 500 according to an embodiment starts (block 502) by identifying a field of interest and a parameter of interest (block 504) and dividing the field of interest into a plurality of tiles (block 506), and determining initial values of the parameter of interest for each tile of the plurality of tiles (block 508). The field of interest may be selected from or in an object design, such as a circuit design, and the parameter of interest may be a characteristic of the object design. In the case of a circuit design, the parameter of interest may be pattern density, perimeter density, reflectivity, or another characteristic of a circuit design as appropriate or desired by a user. The method determines a value of the parameter of interest over the entire field of interest using the initial values (block 510) and determines an initial standard deviation for each tile of the plurality of tiles using the initial value of the parameter of interest for each tile and the initial value of the parameter of interest over the entire field of interest (block 512). A target value of the parameter of interest is determined for each tile of the plurality of tiles using the initial value of the parameter of interest and the initial standard deviation for each tile (block 514), and dummy fill patterns are inserted into selected tiles to adjust the parameter of interest (block 516). The adjusted parameter is compared to an exit condition (block 518), such as to see whether standard deviation is below a threshold. If the exit condition is not satisfied, the adjusted values become the initial values (block 520) and the steps of determining the value of the parameter of interest over the entire field of interest, determining the initial standard deviation for each tile, determining a target value of the parameter of interest for each tile, adjusting the value of the parameter of interest, and comparing to an exit condition (blocks 510-518) are repeated. If the exit condition is satisfied, the method ends (block 522), such as by storing and/or using the adjusted design.

With reference to FIGS. 2, 4, 5, and 9, a parameter optimization method 600 according to an embodiment starts (block 602) with input of the object design and finding required inputs. A parameter of interest y is identified and assigned a value (block 604), a field of interest is identified and divided into a plurality of tiles, a total average value $T_{avg}$ of the parameter is found for the entire field of interest, and a group average value $G_{avg}(n)$ is found for each of the plurality tiles. The group average $G_{avg}(n)$ is the average of a group of tiles around the tile being examined.

By way of illustration, with reference to FIGS. 2, 4, and 5, a current tile or tile of interest 20 is identified and is part of a region 30 encompassing a group of tiles around the tile of interest 20. The particular number of tiles selected as the group 30 may at least include the tiles immediately adjacent the tile of interest and preferably includes a predetermined number of tiles based on the object design and/or number of tiles in the field of interest as a whole and/or the parameter of interest. Each tile 20 has a respective group of tiles 30. The number of tiles in each respective group may be the same, though in embodiments the number of tiles may vary, for example, depending on the location of the tile of interest 20. Effectively, as the method of embodiments progresses, the group 30 "scans" across the field of interest as it "follows" the current tile of interest. In other words, in a first iteration, a first tile of interest has a first group of tiles, while in a second iteration, a second tile of interest adjacent the first tile of interest has a second group of tiles that shares most of the tiles of the first group of tiles. This is shown generally in FIG. 4, where a second tile of interest 20 and its group of tiles 30 are in dark lines, while the previous tile and group are shown in dashed lines. For tiles of interest 20 with groups of tiles 30 that extend over an edge of the field of interest 10, a periodic boundary technique may be employed to have such groups of tiles 30 "wrap around" the field of interest 10 to include tiles on opposite edges of the field of interest. Using such a boundary technique, a group of tiles around a tile of interest in a corner of the field of interest would include tiles from two opposite edges adjacent two other corners of the field of interest. For example, a group for an upper left corner tile would include tiles from the upper right edge and the bottom left edge. While the examples shown and discussed have the tile of interest 20 being at the center of a group of tiles 30 so that the group of tiles 30, including the tile of interest 20, has an odd number of tiles, the tile of interest 20 may be off center with the group of tiles 30 having an even number of tiles.

In embodiments, the tiles 20 and the region 30 are sized so that the ratio of the area of the region 30 to the area of a tile 20 is much greater than 1. For example, in a circuit design including one million tiles, a group of from nine tiles to ten thousand tiles may be selected. More particularly, in a circuit design including one million tiles, a group of from between one hundred and one thousand tiles may provide a better balance of performance and optimization. Still more particularly, in a circuit including one million tiles, a group of between 200 and 600 tiles may provide still better balance between performance and optimization. In an embodiment, an effective length of scale of the parameter of interest is used to determine the size of the region and/or tiles. For example, PC perimeter density has an effect on a length scale of 500 μm. To ensure that an area ratio of region area to tile area is much larger than one, a region size of 500 μm by 500 μm and a tile size of 25 μm by 25 μm could be used so that the area ratio is 400. The size of the tiles then determines the number of tiles in the field of interest.

Returning to FIG. 9, a counter n is incremented (block 606) and is used to identify which tile is currently of interest, and the group average of the current tile of interest ($G_{avg}(n)$) is compared to the total average $T_{avg}$ (block 608). If the group average $G_{avg}$ is less than the total average $T_{avg}$, then the parameter value for current tile $y(n)$ is compared to a maximum allowed parameter value for that tile $y_{max}(n)$ (block 610), which may be predetermined and loaded with the object design or may be calculated. If the parameter value for the current tile $y(n)$ is less than the maximum allowed value $y_{max}(n)$, then an amount by which the parameter value for the current tile of interest $y(n)$ should be increased is determined and an adjusted parameter value for the current tile $y_{new}(n)$ is determined (block 612). The counter is compared to the total number of tiles N (block 614), and if the counter is larger than the total number of tiles, a check is made to see whether a predetermined exit condition is satisfied (block 616). For example, the predetermined exit condition might require that a statistic be below or above a predetermined value in similar fashion to the embodiment shown in FIG. 6, or that a standard deviation of the parameter value be below a threshold value in similar fashion to the embodiment shown in FIG. 7. If the exit condition is satisfied, then the method ends (block 618). If the exit condition is not satisfied, the method goes to the group average determination (block 604) and the remainder of the method is repeated. If at block 614 the counter n is not larger than the total number of tiles N, then the method goes to the counter increment (block 606) and the remainder of the method is repeated.

An example of a method for determining the amount by which the parameter value should be adjusted when the group average $G_{avg}$ is less than the total average $T_{avg}$ is shown in more detail in block 612 and includes finding a first amount of increase for the current tile $a_1(n)$, such as by finding a difference between the maximum allowed value $y_{max}(n)$ and the current value of the parameter y(n) for the tile of interest. A second amount of increase $a_2(n)$ is determined by using the lower of the first amount of increase $a_1(n)$ modified by a constant $k_1$ and a difference between the group average value for the current tile $G_{avg}(n)$ and the total average value $T_{avg}$ of the parameter of interest. A new value of the parameter of interest $y_{new}$ is set as the sum of the initial value y(n) and the second amount of increase $a_2(n)$. In embodiments, the total average value $T_{avg}$ is modified by adding the second amount of increase $a_2(n)$ divided by the total number of tiles N. The constant $k_1$ in embodiments is a predetermined value less than one, particularly from 0.5 to 1, such as a value of 0.75, and may instead be determined based on the object design, the parameter of interest, the number of tiles in the field of interest, and/or other factors as may be appropriate or desired.

If at block 608 the group average $G_{avg}$ is not less than the total average $T_{avg}$, then the parameter value for current tile y(n) is compared to a minimum allowed parameter value for that tile $y_{min}(n)$ (block 620), which may be predetermined and loaded with the object design or may be calculated. If the parameter value y(n) is larger than the minimum for that tile $y_{min}(n)$, then an adjusted value of the parameter of interest $y_{new}(n)$ is found for the tile (block 622), and the method goes to the counter check (block 614). If the parameter value y(n) is not larger than the minimum value $y_{min}(n)$, then the adjusted parameter value $y_{new}(n)$ is set to the initial value of the parameter for the current tile y(n) (block 624) and the method goes to the counter check (block 614). Similarly, if at block 610 the initial value of the parameter for the current tile y(n) is not less than the maximum value, then the adjusted parameter value $y_{new}(n)$ is set to the initial value of the parameter for the current tile y(n) (block 624) and the method goes to the counter check (block 614).

An example of a method for determining the amount by which the parameter value should be adjusted when the group average $G_{avg}$ is not less than the total average $T_{avg}$ is shown in more detail in block 622. A new or adjusted value of the parameter of interest $y_{new}$ is set as the current tile parameter value less an adjustment amount $a_2(n)$ modified by a constant $k_2$. The adjustment amount $a_2(n)$ here is the value found for the nth tile in block 612 in a previous iteration, during which the group average $G_{avg}$ was less than the total average $T_{avg}$. In addition, in embodiments, the total average value $T_{avg}$ is modified by subtracting the adjustment amount $a_2(n)$ modified by the constant $k_2$ divided by the total number of tiles N. The constant $k_2$ in embodiments is a predetermined value less than one, particularly from about 0.1 to about 0.5 to 1, such as a value of 0.1, and may instead be determined based on the object design, the parameter of interest, the number of tiles in the field of interest, and/or other factors as may be appropriate or desired.

Figure 10:
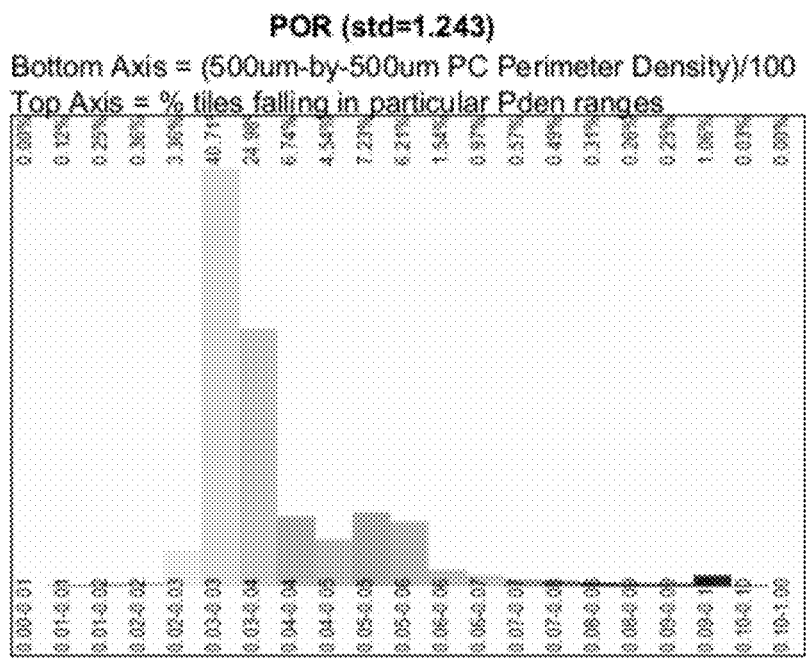
FIGS. 10 and 11 are a comparison of results of prior art methods (FIG. 10) and methods of embodiments (FIG. 11).
Figure 11:
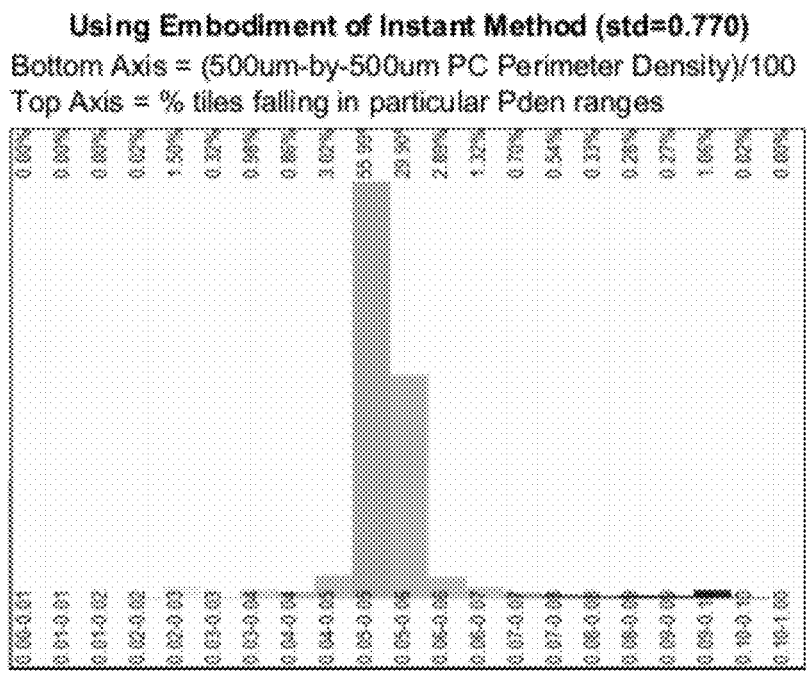

Application of an embodiment of the invention to a circuit design yields improvements in computational efficiency and in the uniformity of parameters of interest. For example, comparing a prior art method of optimization to embodiments of the instant invention where 500 µm by 500 µm PC perimeter density is the parameter of interest and the field of interest is the surface of a circuit design, uniformity improved as much as 38% and runtime was reduced by an order of magnitude for three different chip circuit designs. FIG. 10 shows the PC perimeter density distribution using the prior art method (top graph) and an embodiment of the instant method (bottom graph) for one of the circuit designs. The distribution is much narrower using an embodiment of the instant method, and the standard deviation is reduced from 1.243 to 0.77, both of which indicate that the PC perimeter density for adjusted circuit design is significantly more uniform than that achieved using the prior art method.

An embodiment of the invention can take the form of computer-implemented processes and apparatus for practicing such processes, such as is schematically illustrated in FIG. 1. Additionally, an embodiment can take the form of a computer program product including instructions for execution by a processing circuit, such as computer code in the form of, for example, object code, source code, and/or executable code, on tangible media, such as magnetic media (floppy diskettes, hard disc drives, tape, etc.), optical media (compact discs, digital versatile/video discs, magneto-optical discs, etc.), random access memory (RAM), read only memory (ROM), flash ROM, erasable programmable read only memory (EPROM), or any other computer readable storage medium on which the computer program code is stored and with which the computer program code can be loaded into and executed by a computer. Such is schematically illustrated, for example, by computer code/executable instructions 60 on storage device 122 in FIG. 1. When the computer executes the computer program code, it becomes an apparatus for practicing the invention, and on a general purpose microprocessor, specific logic circuits are created by configuration of the microprocessor with computer code segments. A technical effect of the executable instructions or computer code is to reduce variation of a parameter of interest over a field of interest, for example, in an object design, which, in the case of a circuit design, improves performance of the circuit when fabricated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer-implemented method of reducing variation of a parameter of a circuit design comprising:
   providing the circuit design to a computing device;
   identifying with the computing device a field of interest and a parameter of interest for the circuit design;
   dividing the field of interest into a plurality of tiles with the computing device;
   identifying a region around each tile in the plurality of tiles with the computing device such that a ratio of an area of the region to an area of the respective tile in the plurality of tiles is at least one hundred;
   determining with the computing device initial values of the parameter of interest for the field of interest and for each tile of the plurality of tiles;
   determining with the computing device a variation of the parameter of interest;
   adjusting the parameter of interest with the computing device based at least in part on the initial values of the parameter of interest for each tile and for tiles encompassed by the respective region around the respective tile, including determining a target value of the parameter of interest for each of the plurality of tiles using the initial values of the parameter of interest for each tile and for tiles encompassed by a region around the respective tile by finding a group average parameter value for each tile using the initial values of the tiles encompassed by the region around the respective tile, finding the target value by taking the group average parameter value into account and adjusting the parameter for each tile in accordance with the target value to reduce a standard deviation of the parameter for the respective tile, the target value including a first adjustment amount that is the lesser of:
      a difference between the average parameter value over the entire field of interest and the group average parameter value for the respective tile, and
      a difference between a maximum allowable parameter value for the respective tile and the initial parameter value for the respective tile, modified by a first constant;
   comparing with the computing device the variation of the adjusted parameter of interest to an exit condition;
   storing in at least one of a memory or a non-transitory computer readable storage medium of the computing device the design in response to the variation satisfying the exit condition; and
   in response to the exit condition not being met, setting the adjusted values to the initial values with the computing device, and repeating with the computing device the steps of calculating, adjusting, and comparing until the exit condition is satisfied.

2. The computer-implemented method of claim 1 wherein the determining a variation of the parameter of interest includes determining an initial tile standard deviation for each of the plurality of tiles using the initial value of the parameter of interest over the entire field and the initial value of the parameter of interest for each of the plurality of tiles.

3. The computer-implemented method of claim 1, wherein at least one tile has a maximum allowable parameter value, and the determining a target value is based at least in part on the respective maximum allowable value of the parameter.

4. The computer-implemented method of claim 1, wherein at least one tile has a minimum allowable parameter value, and the determining a target value is based at least in part on the respective minimum allowable value of the parameter.

5. A computer system including at least one computing device configured to implement a method of reducing variation of a parameter in a circuit design, the method comprising:
   identifying a field of interest and a parameter of interest;
   determining an initial value of the parameter of interest over the entire field of interest;
   dividing the field of interest into a plurality of tiles;
   determining an initial value of the parameter of interest for each of the plurality of tiles;
   determining an initial tile standard deviation for each of the plurality of tiles using the initial value of the parameter of interest over the entire field and the initial value of the parameter of interest for each of the plurality of tiles;
   identifying a region around each tile such that a ratio of an area of the respective region to an area of the respective tile is at least one hundred;
   determining a target value of the parameter of interest for each of the plurality of tiles using the initial value of the parameter of interest for each tile and initial values of tiles encompassed by the respective region around the respective tile, including finding a group average parameter value for each tile using the initial values of tiles encompassed by the region around the respective tile and the target value is found taking the group average parameter value into account, and wherein the target value includes a first adjustment amount that is the lesser of:
      a difference between the average parameter value over the entire field of interest and the group average parameter value for the respective tile, and
      a difference between a maximum allowable parameter value for the respective tile and the initial parameter value for the respective tile, modified by a first constant; and
   adjusting the parameter for each tile in accordance with the target value to reduce standard deviation of the parameter for the respective tile.

6. The computer system of claim 5 wherein the respective region around each tile comprises at least tiles bordering the respective tile.

7. The computer system of claim 6 wherein the respective region includes a rectangular region centered around each tile and the ratio of the area of the respective region to the respective tile is at least one hundred.

8. The computer system of claim 7 wherein the ratio is at least four hundred.

9. The computer system of claim 5, wherein the method further comprises repeating, using values of the parameter after adjusting as the initial values of the parameter, the identifying of a field of interest, the determining of an initial value of the parameter of interest over the entire field of interest, the dividing of the field of interest, the determining of an initial value of the parameter of interest for each tile, the determining of an initial tile standard deviation, the identifying of a region around each tile, the determining of a target value of the parameter of interest, and the adjusting of the parameter.

10. The computer system of claim 9, wherein the method further comprises comparing the standard deviation of the adjusted parameter of interest to an exit condition and repeating, using values of the parameter after adjusting as the initial values of the parameter, the identifying of a field of interest, the determining of an initial value of the parameter of interest over the entire field of interest, the dividing of the field of interest, the determining of an initial value of the parameter of interest for each tile, the determining of an initial tile standard deviation, the identifying of a region around each tile, the determining of a target value of the parameter of interest, and the adjusting of the parameter, until the exit condition is satisfied.

11. The computer system of claim 5 wherein the parameter is pattern density and the field of interest is at least a portion of an integrated circuit design.

12. The computer system of claim 5 wherein the parameter is reflectivity and the field of interest is at least a portion of an integrated circuit design.

13. The computer system of claim 5, wherein the method further comprises generating dummy shapes and wherein the adjusting comprises selecting and inserting a respective dummy shape into at least one of the plurality of tiles.

14. A computer program product for optimizing at least one parameter of an object design, the computer program product comprising:
   at least one non-transitory storage medium, readable by a processing circuit, storing an object design and storing instructions for execution by the processing circuit for identifying a field of interest and a parameter of interest;
   determining an initial value of the parameter of interest over the entire field of interest;
   dividing the field of interest into a plurality of tiles;
   determining an initial value of the parameter of interest for each of the plurality tiles;
   determining an initial tile standard deviation for each of the plurality of tiles using the initial value of the parameter of interest over the entire field and the initial value of the parameter of interest for each of the plurality of tiles;
   identifying a respective region around each tile such that a ratio of an area of each region to each respective tile is at least one hundred;
   determining a target value of the parameter of interest for each of the plurality of tiles using the initial value of the parameter of interest for each tile and initial values of tiles encompassed by the region around the respective tile, including finding a group average parameter value for each tile using the initial values of tiles encompassed by the region around the respective tile and the target value is found taking the group average parameter value into account, and wherein the target value includes a first adjustment amount that is the lesser of:
   a difference between the average parameter value over the entire field of interest and the group average parameter value for the respective tile, and
   a difference between a maximum allowable parameter value for the respective tile and the initial parameter value for the respective tile, modified by a first constant;
   adjusting the parameter for each tile in accordance with the target value to reduce standard deviation of the parameter for the respective tile; and
   storing the adjusted object design on the storage medium.

15. The computer program product of claim 14, wherein the instructions for execution by the processing unit further include comparing standard deviation of the adjusted parameter to a threshold value of standard deviation, storing the adjusted object design comprises storing the adjusted object design in response to the standard deviation being below the threshold value, and the determining of an initial tile standard deviation, the determining of a target value, and the adjusting of the parameter are repeated until the standard deviation is below the threshold, the adjusted parameter values being used as the initial values for each iteration.

16. The computer program product of claim 14 wherein the target value includes a second adjustment amount that is a product of the first adjustment amount and a second constant.

17. The computer program product of claim 14 wherein a number of tiles in the region around each tile is determined based at least in part on the parameter of interest.

* * * * *